US008747052B2

(12) United States Patent  (10) Patent No.: US 8,747,052 B2
Emami et al.  (45) Date of Patent: Jun. 10, 2014

(54) AUTOMATION FOR HIGH THROUGHPUT SEMICONDUCTOR BATCH-WAFER PROCESSING EQUIPMENT

(75) Inventors: Arsalan Alan Emami, Aliso Viejo, CA (US); Mitch Agamohamadi, Orange, CA (US); Saeed Sedehi, Orange, CA (US)

(73) Assignee: Beijing Sevenstar Electronics Co., Ltd., Beijing (CN)

( * ) Notice: Subject to any disclaimer, the term of this patent is extended or adjusted under 35 U.S.C. 154(b) by 689 days.

(21) Appl. No.: 11/827,165

(22) Filed: Jul. 10, 2007

(65) Prior Publication Data

US 2008/0118333 A1    May 22, 2008

Related U.S. Application Data

(60) Provisional application No. 60/860,782, filed on Nov. 22, 2006.

(51) Int. Cl.
   *B66C 17/08*    (2006.01)
(52) U.S. Cl.
   USPC .......................................... 414/804; 414/172
(58) Field of Classification Search
   USPC ........................................................ 414/153
   See application file for complete search history.

(56) References Cited

U.S. PATENT DOCUMENTS

| | | | |
|---|---|---|---|
| 4,770,590 A * | 9/1988 | Hugues et al. ................ | 414/172 |
| 4,938,691 A | 7/1990 | Ohkase et al. | |
| 4,976,613 A | 12/1990 | Watanabe | |
| 5,055,036 A | 10/1991 | Asano et al. | |
| 5,112,641 A * | 5/1992 | Harada et al. ................ | 438/542 |
| 5,407,181 A | 4/1995 | Ohsawa et al. | |
| 5,433,784 A * | 7/1995 | Miyagi et al. ................ | 118/715 |
| 5,829,939 A * | 11/1998 | Iwai et al. .................... | 414/411 |
| 5,829,969 A * | 11/1998 | Miyashita et al. ............ | 432/253 |
| 6,054,181 A * | 4/2000 | Nanbu et al. ................. | 427/240 |
| 6,327,794 B2 | 12/2001 | Ishii | |
| 6,540,469 B2 | 4/2003 | Matsunaga et al. | |

(Continued)

FOREIGN PATENT DOCUMENTS

JP    05217928    8/1993

OTHER PUBLICATIONS

PCT/US07/23515 Notification of Transmittal of the International Search Report and the Written Opinion of the International Searching Authority, or the Declaration, May 20, 2008.

*Primary Examiner* — Saul Rodriguez
*Assistant Examiner* — Glenn Myers
(74) *Attorney, Agent, or Firm* — Blakely Sokoloff Taylor & Zafman LLP (57) ABSTRACT

An embodiment of the present invention is a technique to automate transfer of parts for high throughput. A boat transfer unit (BTU) arm carrying a boat containing a plurality of parts is rotated from an initial position to a first position that is below a process chamber. The BTU arm engages a boat support that supports the boat. The BTU arm is moved upward to a second position such that the boat partially enters the process chamber at a distance D with respect to an entrance opening of the process chamber. An elevator arm carrying a pedestal is engaged to lower side of the boat support. The BTU arm is moved away from the second position. The elevator arm is moved upward to fully insert the boat inside the process chamber.

20 Claims, 11 Drawing Sheets

(56) References Cited

U.S. PATENT DOCUMENTS

| | | | |
|---|---|---|---|
| 6,902,369 B2 * | 6/2005 | Tanigawa | 414/674 |
| 7,198,447 B2 * | 4/2007 | Morimitsu et al. | 414/217 |
| 2005/0053891 A1 * | 3/2005 | Mochizuki et al. | 432/250 |
| 2005/0136591 A1 * | 6/2005 | An | 438/255 |

* cited by examiner

AUTOMATION FOR HIGH THROUGHPUT SEMICONDUCTOR BATCH-WAFER PROCESSING EQUIPMENT

RELATED APPLICATION

This application claims the benefit of the provisional application, titled "Automation For Higher Throughput Semiconductor Batch-Wafer Processing Equipment", filed Nov. 22, 2006, Ser. No. 60/860,782.

BACKGROUND

1. Field of the Invention

Embodiments of the invention relate to semiconductor processing equipment. In particular, embodiments of present invention are related to batch wafer processing equipment.

2. Description of Related Art

Most semiconductor processing equipment utilizes robotics to transfer silicon wafers to specific locations within the system for conduct of processes to modify the wafer surface. One example of batch wafer processing is vertical diffusion furnaces used to form thermal oxides, diffuse in dopant layers, or deposit oxides, nitrides or other layers by chemical vapor deposition (CVD).

For most large batch processing, the product in the form of silicon wafers or other shape substrates having a diameter of 100 mm or greater, are placed into slots of a wafer carrier, sometimes called a rack or wafer boat. The wafer boat is mounted vertically on top of a heat blocking support structure (called a pedestal) which in turn sits upon a door closure assembly, referred to as the process chamber door. For most current large batch systems, the assembly to be inserted into the process chamber area consists of the door, pedestal, and wafer carrier. That stack of separable parts is moved as a unit under the open lower end of the process chamber (e.g., process tube) and then moved upward into the process chamber until the door assembly closes against a flange at the lower end of the process chamber or tube.

For higher throughput, batch systems frequently have two or even three such door, pedestal, carrier assemblies and a means for moving that stacked assembly from a load/unload position to the insertion position under the process chamber.

The desire to minimize cost and time per wafer processed in general favors the use of the largest number of parts possible per processing cycle. The batch size however, becomes constrained by overall system height and process uniformity which limits the spacing between parts which is set by the slot pitch of the wafer carrier.

Existing techniques to automate the process to allow more parts to be processed have a number of drawbacks. One technique moves the slots closer together or lengthens the wafer boat. The technique reduces the wafer boat slot pitch. Another technique increases the length of the wafer boat or boat to allow for adding additional wafer slots to accommodate a larger load size. However, this technique increases the space below the process chamber as well as the length of the process chamber.

For current system designs, the door, pedestal, and wafer boat are moved as one unit, once assembled. The requirement for space below the chamber for the door/pedestal/carrier assembly has set an upper limit on the number of parts (e.g., wafers) that can be placed in a wafer carrier (e.g., wafer boat) processed in a single cycle.

BRIEF DESCRIPTION OF THE DRAWINGS

Embodiments of invention may best be understood by referring to the following description and accompanying drawings that are used to illustrate embodiments of the invention. In the drawings.

DESCRIPTION

An embodiment of the present invention is a technique to automate the transfer of parts for high throughput. A boat transfer unit (BTU) arm carrying a boat that contains a plurality of parts is rotated from an initial position to a first position that is below a process chamber. The BTU arm engages a boat support that supports the boat. The BTU arm is moved upward to a second position such that the boat partially enters the process chamber at a distance D with respect to an entrance opening of the process chamber. An elevator arm carrying a pedestal is engaged to lower side of the boat support. The BTU arm is moved away from the second position. The elevator arm is moved upward to fully insert the boat inside the process chamber.

In the following description, numerous specific details are set forth. However, it is understood that embodiments of the invention may be practiced without these specific details. In other instances, well-known circuits, structures, and techniques have not been shown to avoid obscuring the understanding of this description.

One embodiment of the invention may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a program, a procedure, a method of manufacturing or fabrication, etc.

An embodiment of the present invention is a technique to automate the transfer of parts for high throughput. The technique uses existing equipment to increase the number of parts that may be handled. In this manner, the overall throughput may be increased. In addition, the sequence of operations may be overlapped so that while a batch of parts is being unloaded from the process chamber, another batch may be prepared for loading to the process chamber.

An embodiment of the invention is to utilize a unique automation scheme in a way that allows more parts to be processed in a single processing cycle without increasing the overall system height and without reducing the wafer carrier slot pitch. This is done by use of the entire space below the chamber to load parts (e.g., wafers) into the wafer carrier. Following loading of the wafer carrier, the wafer carrier is then pushed up into the process chamber, creating enough space below it, for the door/pedestal to rotate and place under it. In this manner, the space originally allowed for the door/pedestal is now used for additional parts (e.g., wafers). This unique approach to utilization of space and automation results in higher number of parts processed in each cycle.

The technique first rotates a boat transfer unit (BTU) arm carrying a boat that contains a plurality of parts from an initial position to a first position that is below a process chamber. Then, the BTU arm is moved upward to partially inside the process chamber by a distance to make room for the elevator arm with pedestal to move in. The elevator arm then rotates to engage to the boat support. After the elevator arm secures the boat support, the BTU arm moves away so that the elevator arm may push the boat to fully insert the boat inside the process chamber. In this way, the boat may contain an additional batch of parts without modifying the existing housing portion below the chamber. The parts in the additional batch occupy the space provided by the distance D1 as explained below.

Figure 1:
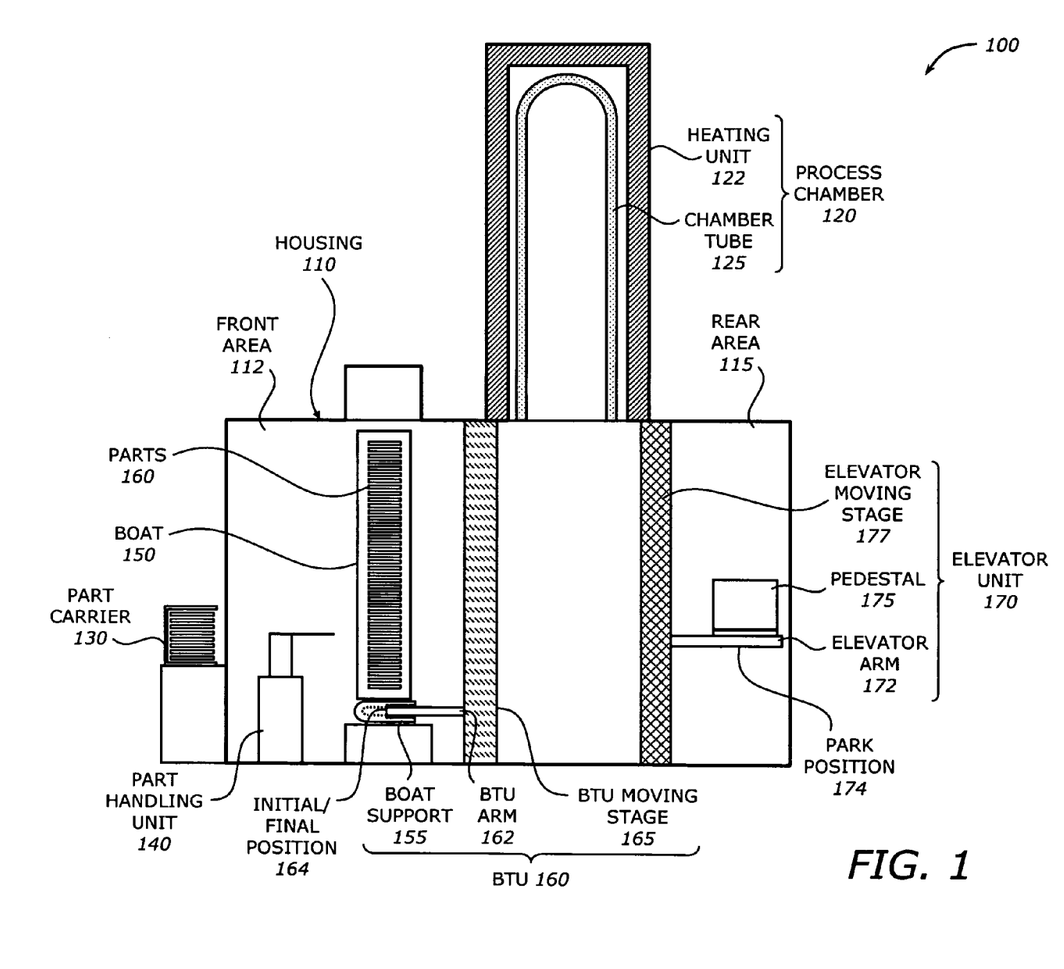
FIG. 1 is a diagram illustrating a system at an initial stage according to one embodiment of the invention.

FIG. 1 is a diagram illustrating a system 100 at an initial stage according to one embodiment of the invention. The system 100 may be any system that process parts. In one embodiment, the system is a batch type vertical diffusion system (atmospheric or low-pressure chemical vapor deposition (LPCVD)) which processes semiconductor wafers or substrates. The system 100 includes a housing 110, a process chamber 120, a part carrier 130, a part handling unit 140, a BTU 160, and an elevator unit 170.

The housing 110 provides the space for the various units and components in the parts processing system. It includes a front area 112 and a rear area 115. The designation of "front" and "rear" is merely for ease of reference and does not necessarily indicate the location of the areas. The front area 112 is the area to receive or unload the parts from and to the part carrier 130. The part carrier 130 contains the parts to be processed or the parts that have been already processed. The rear area 115 provides space for the elevator unit 170. The rear area 115 also has a space right below the process chamber used as the working area for the parts to be transferred to and from the process chamber 120.

The process chamber 120 is the chamber that processes the parts. It is located above the rear area 115 of the housing 110. In one embodiment, the process operations include heating the wafers. The process chamber 120 includes a heating unit 122 and a chamber tube 125. The heating unit 122 generates heat at a pre-determined temperature for a pre-determined period while the parts are held inside the chamber tube 125. The chamber tube 125 is disposed within the heating unit 122. It may have pipes that provide gas to evacuate or clean the chamber tube 125 as part of the processing. The process chamber 120 has a door or an entrance opening to allow the elevator unit to push the boat containing the parts inside the chamber tube 125.

The part carrier 130 is a carrier that contains the parts. It may have a port opening to allow the parts to be picked up or transferred to or from the BTU 160. While in the loading station in the front area 112, the boat 150 is filled with material to be processed by action of the part handling unit 140 which moves the parts from storage, such as cassettes for 100-mm diameter and/or larger size wafers or front opening universal pods (FOUPs) for 300-mm wafers and/or larger size wafers, to the slots of the boat 150. The loading of the boat 150 may be done by moving a single part (e.g., wafer or other shape substrates) at a time or moving parts in groups of more than one using a multi-pronged pick-up tool. The part handling unit 140 is a mechanism automated to pick up the parts from the part carrier 130 and transfer to the BTU 160. It also picks up the parts from the BTU 160 and transfers to the part carrier 130 in an unloading operation.

The BTU 160 is a unit that moves the parts contained in a boat 150 or a carrier to and from the rear area 115. It includes a BTU arm 162 and a BTU moving stage 165. The BTU arm 162 is typically extended horizontally to hold the boat 150 that contains the parts 160. The BTU moving stage 165 is a mechanism that controls the movement of the BTU arm 162. It may include stepper motors or other actuators to cause the BTU arm 162 to rotate on a horizontal plane or move up and down vertically.

The boat 150 is a container that contains or stores the parts 160 transferred from the part carrier 130 during a loading operation or the process chamber 120 during an unloading operation. The parts 160 may be any parts that need to be processed in the process chamber 120. In one embodiment, the parts 160 include semiconductor wafers or substrates. The parts 160 may be organized to occupy inside the boat 150 vertically. They may be stacked vertically. The boat 150 may have a boat support 155 that supports the boat. The boat support 155 is securely attached to the bottom of the boat 150. It may have a slot or an engagement mechanism to allow the BTU arm 162 to engage firmly. The BTU arm 162 may engage the boat support 155 by moving into the slot and disengage it by moving out of the slot. The boat support 155 may also have a receptacle, pads, or an engagement mechanism at the bottom to allow the elevator arm in the elevator unit 170 to engage firmly.

The BTU arm 162 is at an initial/final position 164 in the front area 112. In this initial/final position, the BTU arm 162 engages the boat support 155 to hold the boat 150 containing the parts 160. The parts 160 may be the unprocessed parts to be transferred to the process chamber 120 during the loading. The initial/final position 164 then corresponds to the initial position of the loading sequence. The parts 160 may also be the processed parts that have been processed from the process chamber 120 during the unloading. The initial/final position 164 then corresponds to the final position of the unloading sequence.

The elevator unit 170 includes an elevator arm 172, a pedestal 175, and an elevator moving stage 177. The elevator arm 172 holds up the pedestal 175 as a support unit. The pedestal 175 may act as a heat blocking unit. The pedestal 175 may be optional if the elevator arm 172 is sufficiently strong, rigid, and mechanically stable to support the boat 150. The elevator moving stage 177 causes the elevator arm 172 and the pedestal 175 to rotate and move up and down. At the beginning, the elevator arm 172 and the pedestal are at a park position 174.

Figure 2:
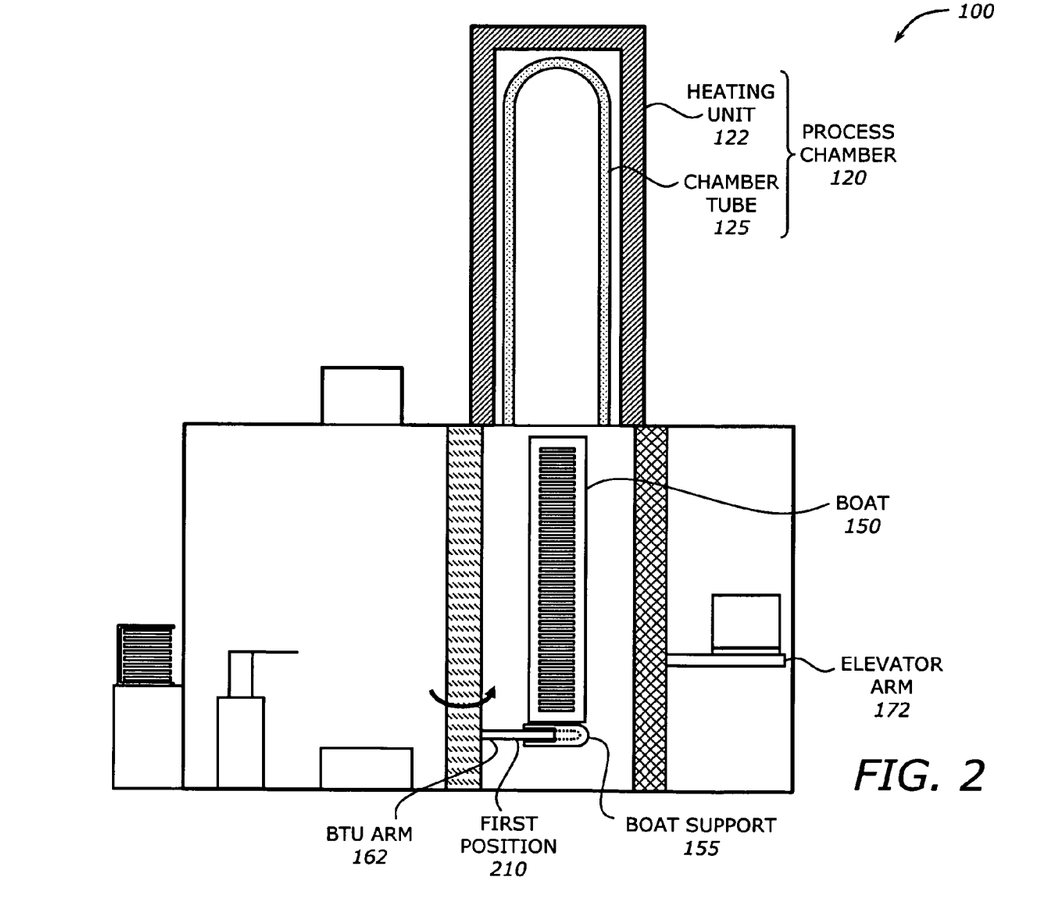
FIG. 2 is a diagram illustrating a system at a second stage of loading according to one embodiment of the invention.

FIG. 2 is a diagram illustrating the system at a second stage of loading according to one embodiment of the invention. At the second stage of the loading sequence, the BTU arm 162 is rotated from the initial position 164 to a first position 210. The rotation takes place in a horizontal plane around the BTU moving stage 165. The boat 150 is moved from the front area 112 to the rear area 115. The first position 210 is directly below the process chamber 120. The boat 150 is positioned right below the entrance opening of the process chamber 120.

The elevator unit 170 is in the park position 174. At the first position 210, the space clearance between the bottom of the boat support 155 and the floor may not be large enough for the elevator unit 170 to fit in. This is because the boat 150 is configured to carry more parts than the normal configuration to increase the overall throughput.

Figure 3:
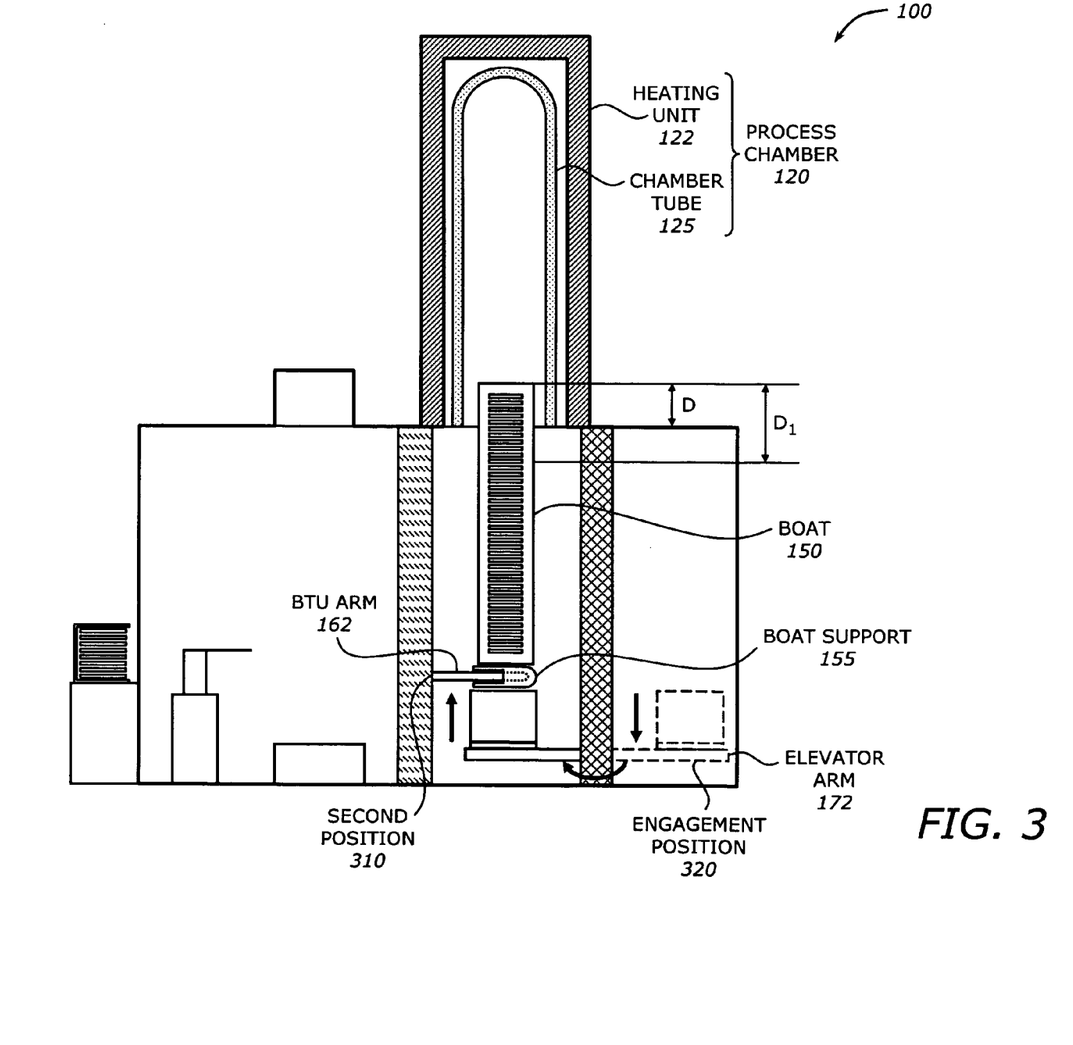
FIG. 3 is a diagram illustrating a system at a third stage of loading according to one embodiment of the invention.

FIG. 3 is a diagram illustrating a system at a third stage of loading according to one embodiment of the invention. At the third stage of the loading sequence, the BTU arm 162 is moved upward to a second position 310. The second position 310 is at a vertical location above the first position 210 by a distance D1. This distance D1 provides the additional space that the boat 150 has been extended to accommodate more parts than the normal load. The distance D1 is such that it provides enough room between the bottom of the boat support 155 and the ground floor for the elevator unit 170. The boat 150 partially enters the process chamber 120 at a distance D<D1 with respect to an entrance opening of the process chamber 120.

The elevator arm 172 carrying the pedestal 175 is moved from the park position 174 to be engaged to the lower side of the boat support 155. The pedestal 175 is positioned to hold the boat support 155 firmly. This may be accomplished by moving the elevator arm 172 from the park position 174 to an engage position 320 which is below the second position. Then, the elevator arm 172 is rotated to under the BTU arm 162, and the elevator arm 172 is moved slightly upward to engage to the lower side of the boat support 150.

Figure 4:
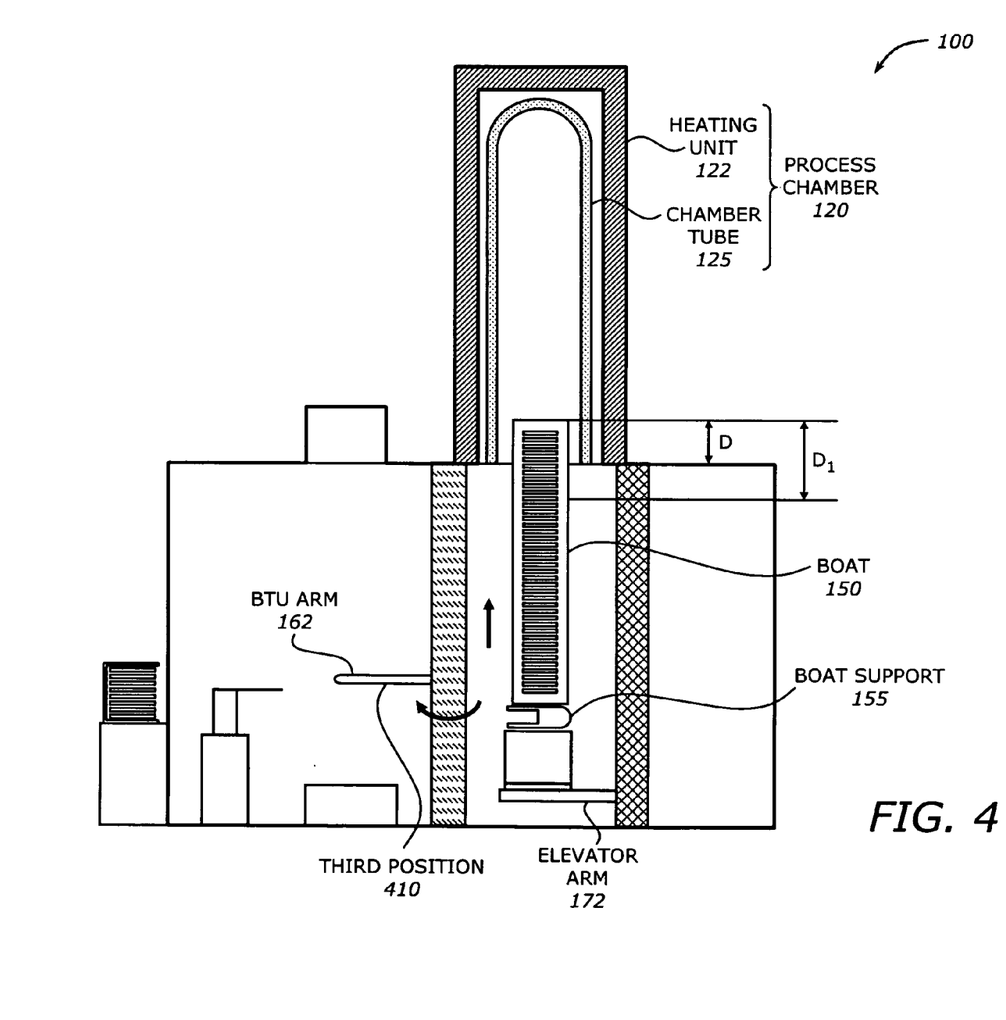
FIG. 4 is a diagram illustrating a system at a fourth stage of loading according to one embodiment of the invention.

FIG. 4 is a diagram illustrating a system at a fourth stage of loading according to one embodiment of the invention. At the fourth stage, the BTU arm 162 is moved away from the second position to allow free movement of the boat 150 pushed by the elevator arm 172. This may be accomplished by first disengaging the BTU arm 162 from the boat support 155. Next, the BTU arm 162 is rotated from the second position 310 to a third position 410. Then, the BTU arm 162 is moved from the third position 410 to the initial/final position 164.

Figure 5:
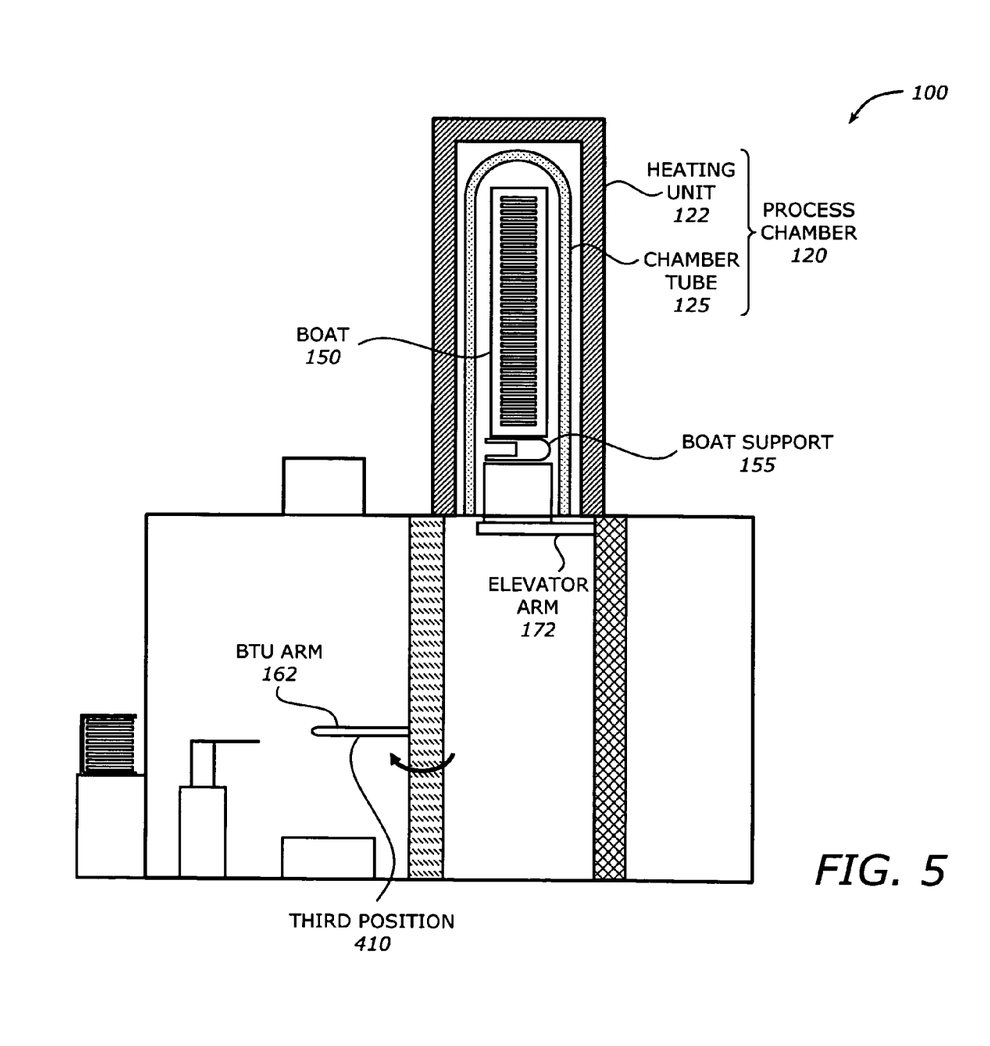
FIG. 5 is a diagram illustrating a system at a final stage of loading according to one embodiment of the invention.

FIG. 5 is a diagram illustrating a system at a final stage of loading according to one embodiment of the invention. At the final stage of the loading sequence, the elevator arm 172 and the pedestal 175 are moved upward to fully insert the boat 150 inside the process chamber 120. The elevator arm 172 and the pedestal 175 stop when a position of door closure is reached, sealing the door assembly against the flange at the lower end of the process chamber 120.

The process chamber 120 processes the parts 160 once the boat is fully inserted into the process chamber 120 and the door at the entrance opening of the process chamber 120 is securely closed. A process recipe is called and run under computer control which controls the chamber temperature, pressures, gas flows and time and sequence of processing steps. After the parts 160 are processed, they are ready to be unloaded from the process chamber 120.

The unloading sequence of the parts 160 from the processing chamber 120 is essentially the reverse of the loading sequence. The unloading sequence starts from the stage where the boat 150 holding the parts 160 is inside the process chamber 120.

Figure 6:
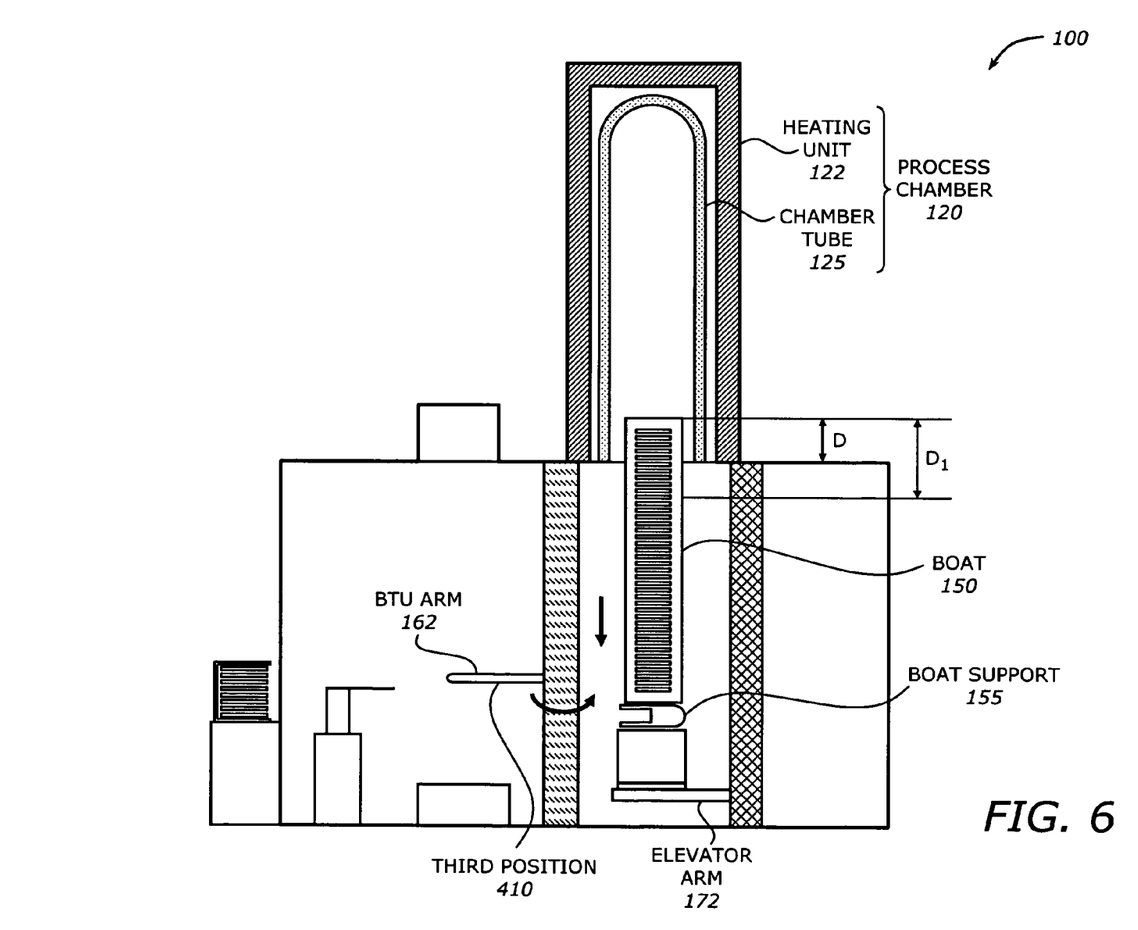
FIG. 6 is a diagram illustrating a system at a second stage of unloading according to one embodiment of the invention.

FIG. 6 is a diagram illustrating a system at a second stage of unloading according to one embodiment of the invention. At the second stage of the unloading sequence, the door of the process chamber 120 is opened. The elevator arm 172 is engaged to the boat support 155.

The elevator moving stage 177 causes the elevator arm 172 to move downward to the second position 310 such that the boat 150 remains partially inside the process chamber 120 at the distance D with respect to the entrance opening of the process chamber 120. During that time, the BTU arm 162 is at the third position 410 or may be at any other position in the front area 112.

Figure 7:
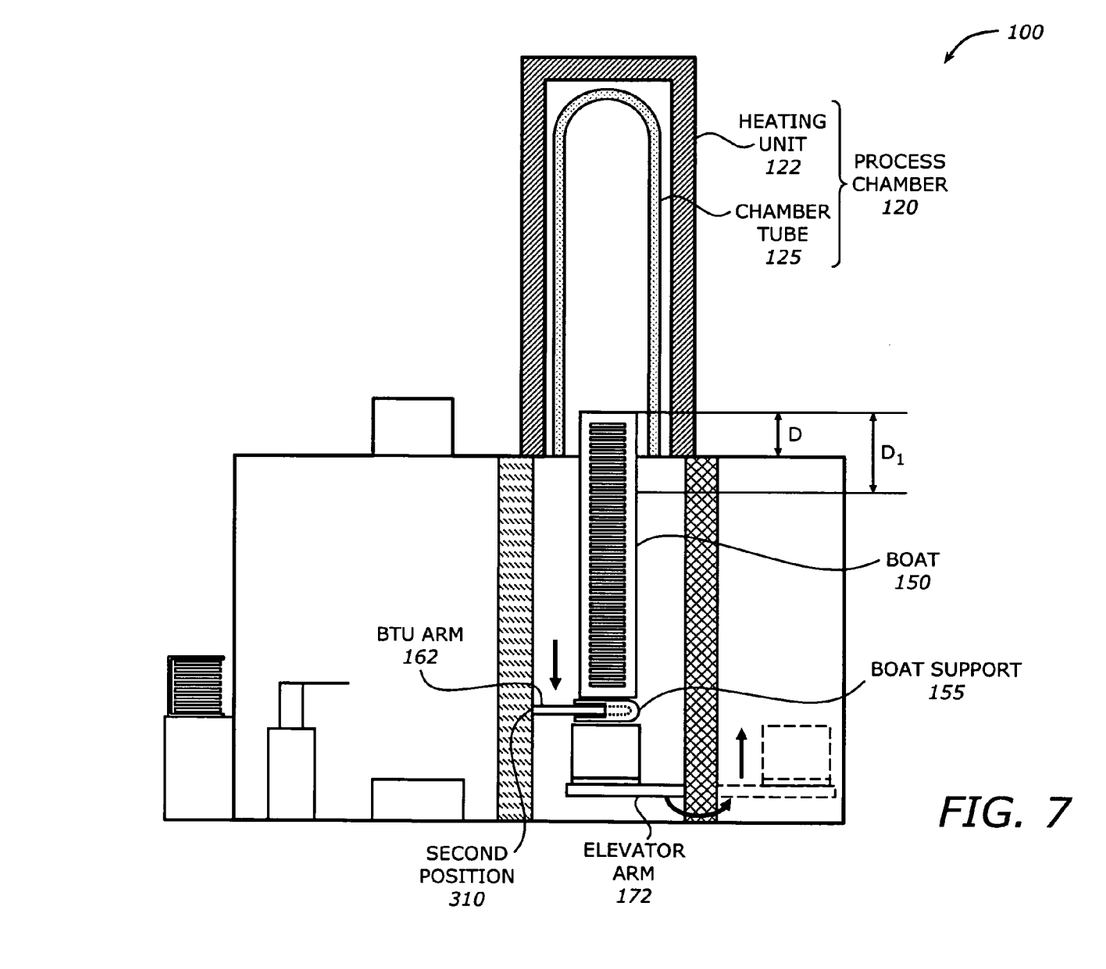
FIG. 7 is a diagram illustrating a system at a third stage of unloading according to one embodiment of the invention.

FIG. 7 is a diagram illustrating a system at a third stage of unloading according to one embodiment of the invention. At the third state of the unloading sequence, the BTU arm 162 is engaged to the boat support 155. This may be accomplished by moving the BTU arm 162 from the third position 410, or from any other position in the front area 112, to the position aligned with the second position 310. Then the BTU arm 162 is rotated to the second position 310 to engage the boat support 155.

At this time, the elevator arm 172 is moved away from the second position 310. This may be accomplished by rotating the elevator arm 172 with the pedestal 175 from the second position 310 to the engage position 320 around the elevator moving stage 177. The elevator arm 172 and the pedestal 175 are then moved to the park position 174.

Figure 8:
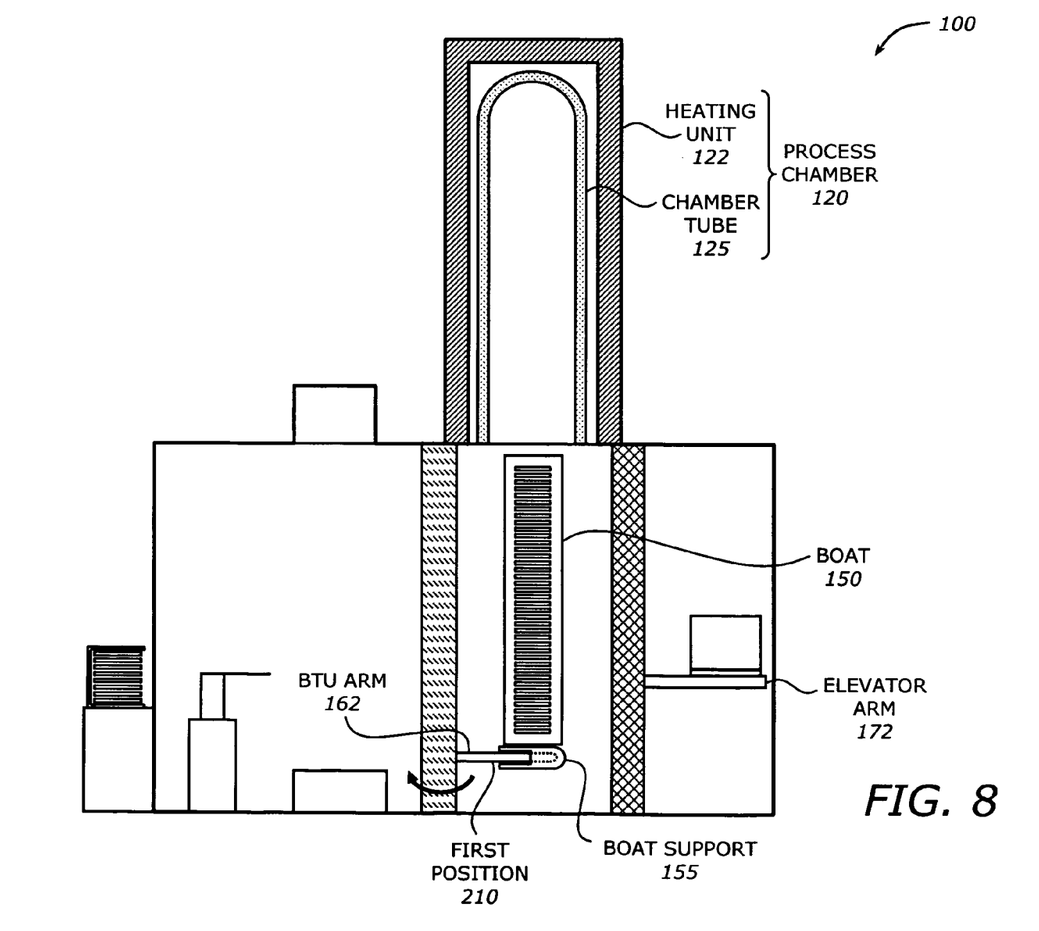
FIG. 8 is a diagram illustrating a system at a fourth stage of unloading according to one embodiment of the invention.

FIG. 8 is a diagram illustrating a system at a fourth stage of unloading according to one embodiment of the invention. At the fourth stage of the unloading sequence, the BTU arm 162 is moved downward from the second position 310 to the first position 210. The boat 150 is now completely outside the process chamber 120. Then, the BTU arm 162 is rotated from the first position 210 to the initial/final position 164 in the front area 112.

To increase the throughput of the system, there may be two or more wafer load positions and two or more boats. The same or another BTU arm may move a pre-loaded boat under and up into the mouth of the process chamber 120. That second boat may be picked-up on a door and pedestal carried on an elevator arm and raised into the processing position while the first boat is being unloaded and reloaded for use in a subsequent process cycle.

The design is unique in that the boat 150 is partially inserted into the lower end of the process chamber 120 and then the door and pedestal is positioned below the boat 150. This sequence reduces the height requirement for part handling zone below the process chamber 120, allowing use of a longer process tube, longer boat, and longer process zone while still maintaining the overall system height within fixed constraints, with the exception of heater height.

In addition, embodiments of the invention utilize the maximum available space to pack the parts (e.g., wafers) in the boat 150 to improve the overall throughput because the number of parts increases compared to prior art techniques. The additional space is equivalent to the distance D1.

Figure 9:
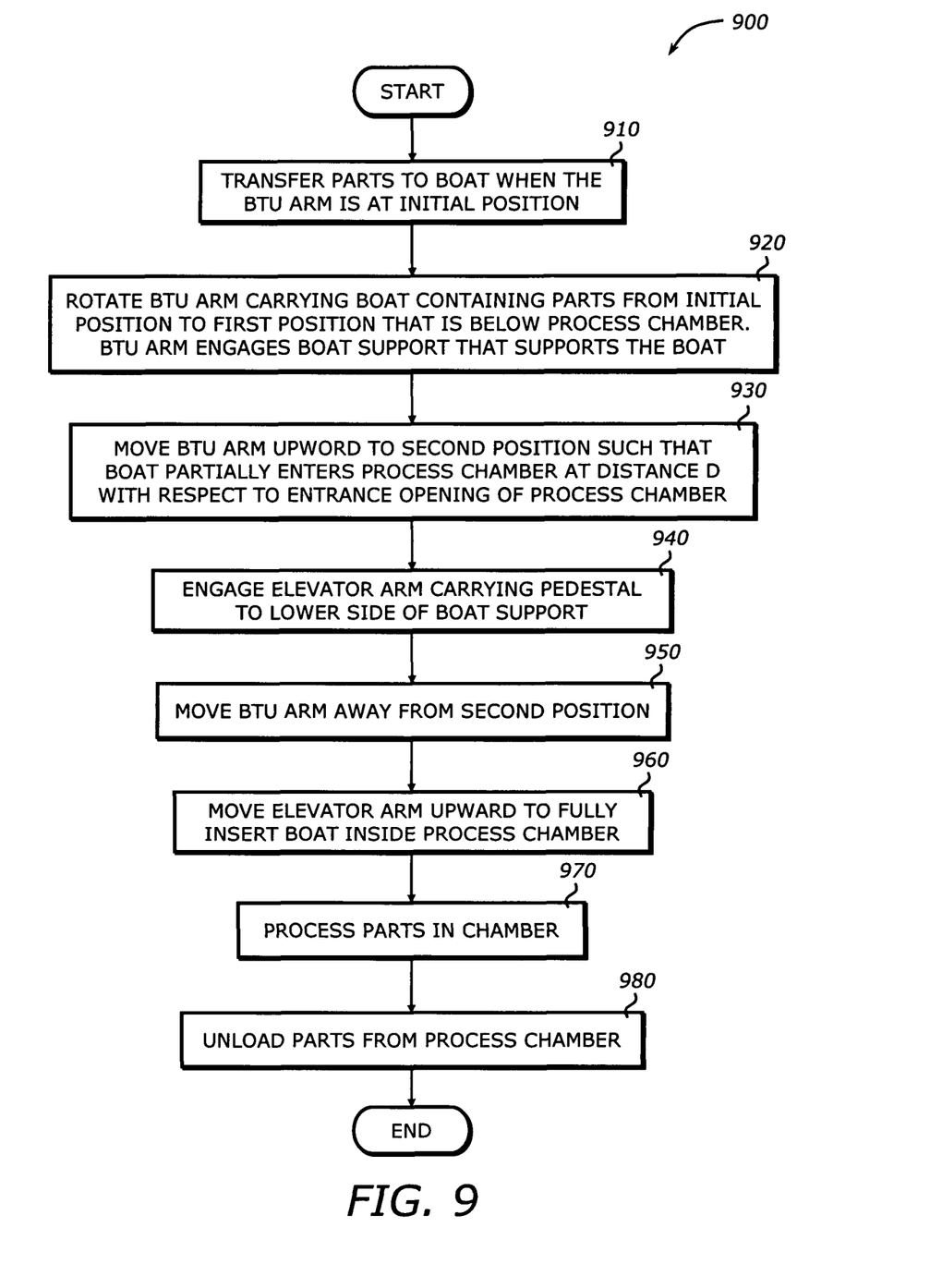
FIG. 9 is a flowchart illustrating a process to automate parts transfer for high throughput according to one embodiment of the invention.

FIG. 9 is a flowchart illustrating a process 900 to automate parts transfer for high throughput according to one embodiment of the invention.

Upon START, the process 900 transfers a plurality of parts to the boat when the BTU arm is at an initial position (Block 910). Next, the process 900 rotates a boat transfer unit (BTU) arm carrying a boat containing the parts from the initial position to a first position that is below a process chamber (Block 920). The BTU arm engages a boat support that supports the boat.

Then, the process 900 moves the BTU arm upward to a second position such that the boat partially enters the process chamber at a distance D with respect to an entrance opening of the process chamber (Block 930). Next, the process 900 engages an elevator arm carrying a pedestal to lower side of the boat support (Block 940). Then, the process 900 moves the BTU arm away from the second position (Block 950). Next, the process 900 moves the elevator arm upward to fully insert the boat inside the process chamber.

Then, the process 900 processes the parts in the chamber (Block 970). This may include any processing operations taking place inside the process chamber. In one embodiment, this includes generating heat and various gases to the process chamber. Next, the process 900 unloads the parts from the process chamber (Block 980). The process 900 is then terminated.

Figure 10:
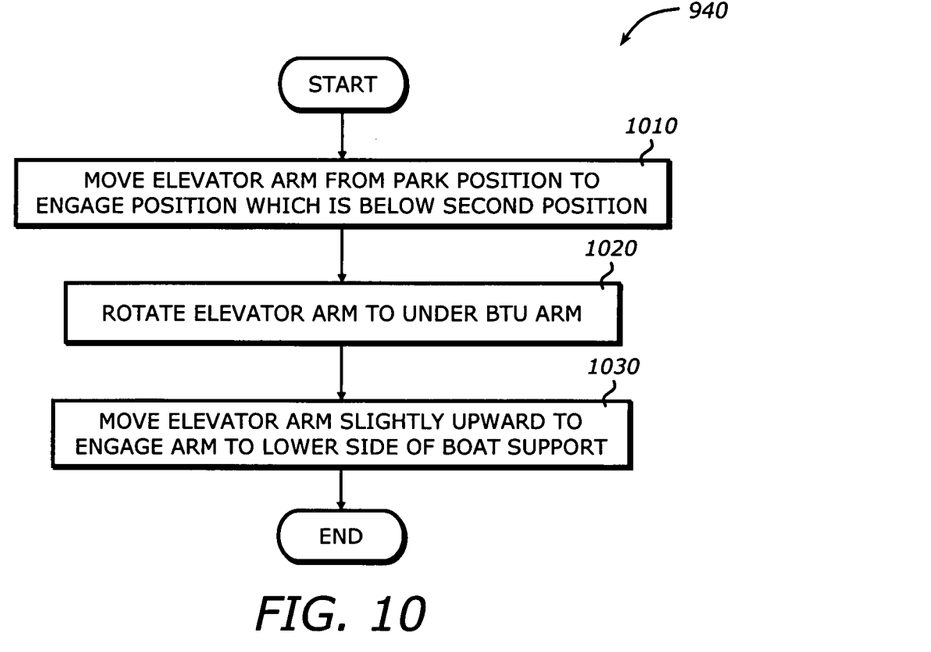
FIG. 10 is a flowchart illustrating a process to engage an elevator arm to lower side of a boat support according to one embodiment of the invention.

FIG. 10 is a flowchart illustrating the process 940 to engage an elevator arm to lower side of a boat support according to one embodiment of the invention.

Upon START, the process 940 moves the elevator arm from a park position to an engage position which is below the second position (Block 940). Next, the process 940 rotates the elevator arm to under the BTU arm at the second position (Block 1020). Then, the process 940 moves the elevator arm slightly upward to engage the elevator arm to the lower side of the boat support (Block 1030). The process 940 is then terminated.

Figure 11:
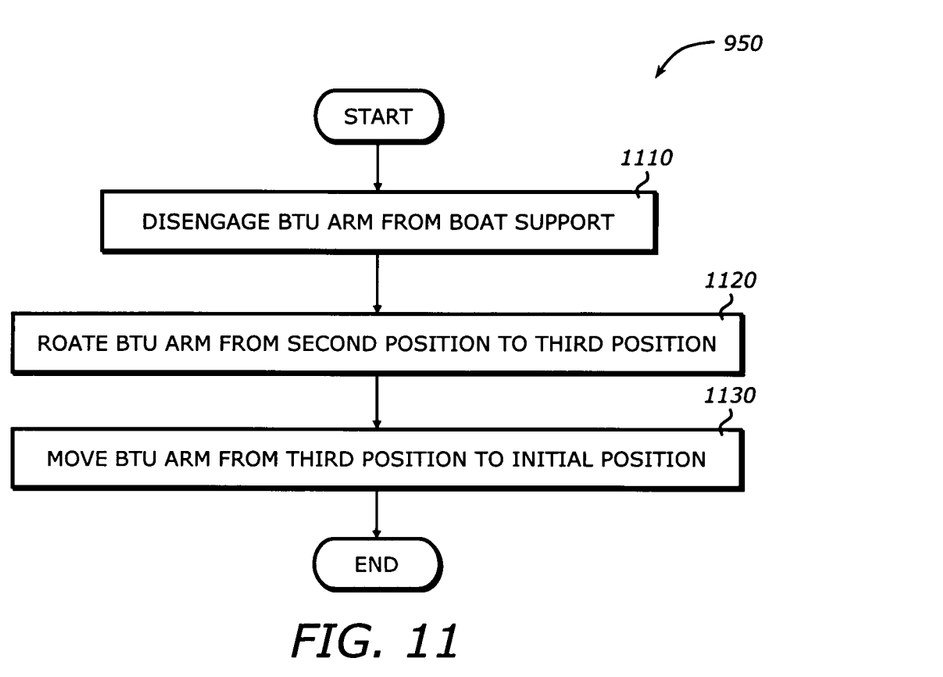
FIG. 11 is a flowchart illustrating a process to move the BTU arm away from the second position according to one embodiment of the invention.

FIG. 11 is a flowchart illustrating the process 950 to move the BTU arm away from the second position according to one embodiment of the invention.

Upon START, the process 950 disengages the BTU arm from the boat support (Block 1110). Next, the process 950 rotates the BTU arm from the second position to a third position (Block 1120). Then, the process 950 moves the BTU arm from the third position to the initial position (Block 1130). The process 950 is then terminated.

Figure 12:
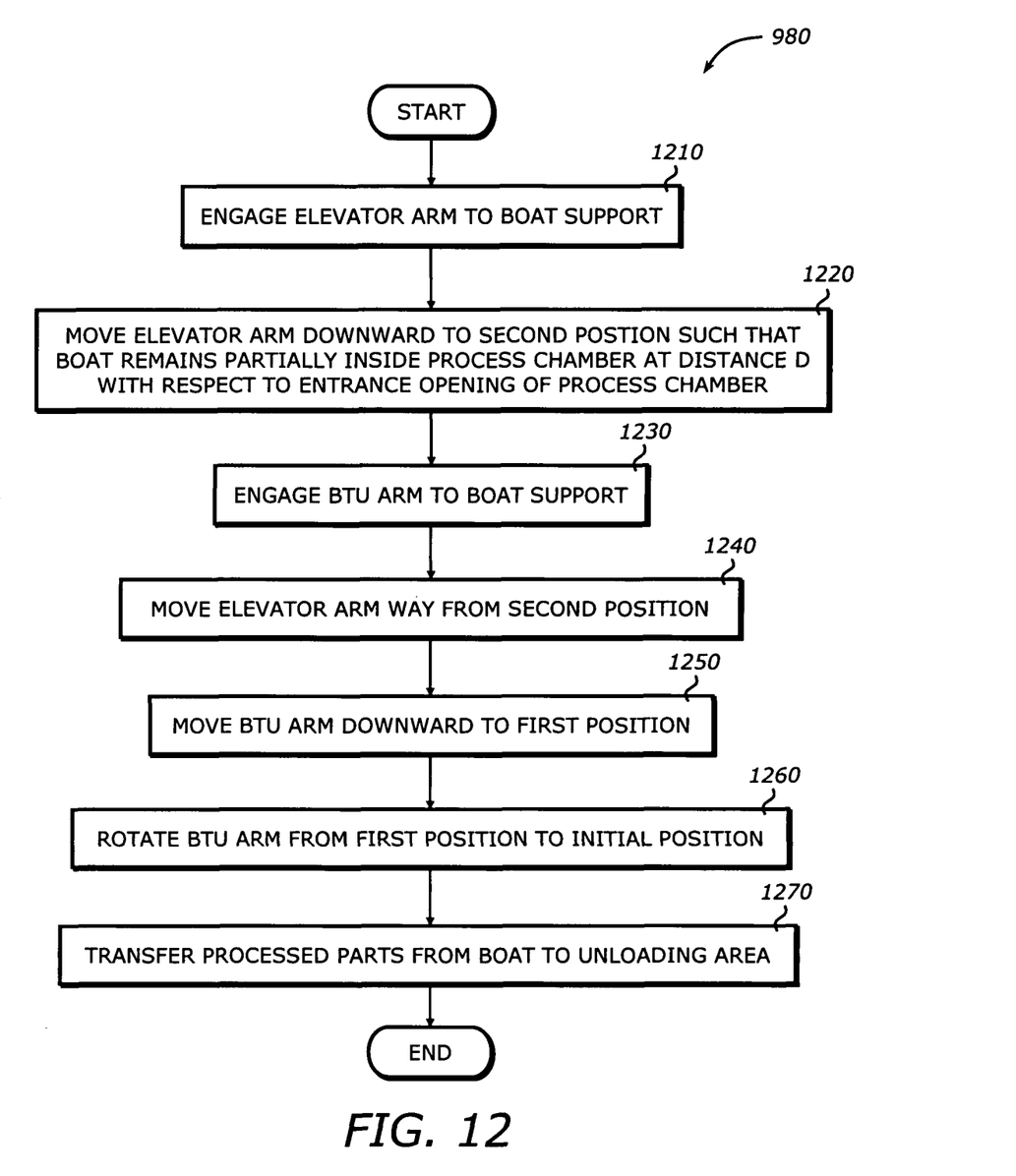
FIG. 12 is a flowchart illustrating a process to unload parts from the process chamber according to one embodiment of the invention.

FIG. 12 is a flowchart illustrating the process 980 to unload parts from the process chamber according to one embodiment of the invention.

Upon START, the process 980 engages the elevator arm to the boat support (Block 1210). Next, the process 980 moves the elevator arm downward to the second position such that the boat remains partially inside the process chamber at the distance D with respect to the entrance opening of the process chamber (Block 1220). Then, the process 980 engages the BTU arm to the boat support (Block 1230).

Next, the process 980 moves the elevator arm away from the second position (Block 1240). Then, the process 980 moves the BTU arm downward to the first position (Block 1250). Next, the process 980 rotates the BTU arm from the first position to the initial position (Block 1260). Then, the process 980 transfers the plurality of parts from the boat to an unloading area (Block 1270). The process 980 is then terminated.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. A method comprising:
    rotating a boat transfer unit (BTU) arm carrying a boat containing a plurality of parts from an initial position to a first position that is below a process chamber, wherein the BTU arm engages a boat support that supports the boat and moves the boat support from the initial position to the first position, the initial position being in a front area of a housing with respect to the process chamber, wherein the boat support includes a slot and the BTU arm engages the boat support by moving into the slot;
    moving the BTU arm upward with the boat support engaged to a second position such that the boat partially enters the process chamber at a distance D with respect to an entrance opening of the process chamber;
    engaging an elevator arm carrying a pedestal from a rear area of the housing with respect to the process chamber to a lower side of the boat support;
    moving the BTU arm away from the second position to disengage from the boat support by moving the BTU arm out of the slot; and
    moving the elevator arm upward to fully insert the boat inside the process chamber.

2. The method of claim 1 further comprising:
    unloading the plurality of parts from the process chamber.

3. The method of claim 2 wherein unloading the plurality of parts comprises:
    engaging the elevator arm to the boat support;
    moving the elevator arm downward to the second position such that the boat remains partially inside the process chamber at the distance D with respect to the entrance opening of the process chamber;
    engaging the BTU arm to the boat support;
    moving the elevator arm away from the second position;
    moving the BTU arm downward to the first position; and
    rotating the BTU arm from the first position to the initial position.

4. The method of claim 3 wherein unloading the plurality of parts further comprises:
    transferring the plurality of parts from the boat to an unloading area.

5. The method of claim 1 wherein engaging the elevator arm comprises:
    rotating the elevator arm to under the BTU arm; and
    moving the elevator arm slightly upward to engage the elevator arm to the lower side of the boat support.

6. The method of claim 5 further comprising:
    moving the elevator arm from a park position in the rear area to an engage position in the rear area, the engage position being below the second position prior to rotating the elevator arm.

7. The method of claim 1 wherein moving the BTU arm away from the second position comprises:
    rotating the BTU arm from the second position to a third position.

8. The method of claim 7 wherein moving the BTU arm away from the second position further comprises:
    moving the BTU arm from the third position to the initial position.

9. The method of claim 1 further comprising:
    transferring the plurality of parts to the boat when the BTU arm is at the initial position prior to rotating the BTU arm.

10. The method of claim 1 wherein the plurality of parts comprises a plurality of semiconductor substrates.

11. The method of claim 1 wherein the process chamber includes a heater unit and a process tube.

12. A system comprising:
    a process chamber;
    a housing including a front area with respect to the process chamber and a rear area with respect to the process chamber;

a boat transfer unit (BTU) including a BTU arm and a BTU moving stage, the BTU arm engaging a boat support that supports a boat containing a plurality of parts, wherein the boat support includes a slot and the BTU arm engages the boat support by moving into the slot when the BTU is in the initial position and the boat is vertically aligned; and an elevator unit having an elevator arm initially in the rear area with respect to the process chamber;

wherein the BTU moving stage causes the BTU arm to rotate from an initial position in the front area with respect to the process chamber to a first position that is below the process chamber, wherein the BTU arm moves the boat support from the initial position to the first position, and to move the BTU arm upward with the boat support engaged to a second position such that the boat partially enters the process chamber at a distance D with respect to an entrance opening of the process chamber;

to move the BTU arm away from the second position to disengage from the boat support by moving the BTU arm out of the slot; and wherein the elevator arm is engaged from the rear area to a lower side of the boat support and moves upward to fully insert the boat inside the process chamber after the BTU arm is moved away from the second position.

13. The system of claim 12 wherein the BTU and the elevator unit unload the plurality of parts from the process chamber.

14. The system of claim 13 wherein the elevator unit engages the elevator arm to the boat support and moves the elevator arm downward to the second position such that the boat remains partially inside the process chamber at the distance D with respect to the entrance opening of the process chamber.

15. The system of claim 14 wherein the BTU moving stage engages the BTU arm to the boat support and moves the BTU arm downward to the first position after the elevator arm moves away from the second position.

16. The system of claim 15 wherein the BTU moving stage causes the BTU arm to move from the first position to the initial position.

17. The system of claim 12 wherein the elevator unit causes the elevator arm to rotate under the BTU arm and to move slightly upward to engage the elevator arm to the lower side of the boat support.

18. The system of claim 17 wherein the elevator unit further causes the elevator arm to move from a park position in the rear area to an engage position in the rear area, the engage position being below the second position prior to cause the elevator arm to rotate.

19. The system of claim 12 wherein the BTU moving stage disengages the BTU arm from the boat support by moving the BTU arm out of the slot and rotates the BTU arm from the second position to a third position to move the BTU arm away from the second position.

20. The system of claim 19 wherein the BTU moving stage causes the BTU arm to move from the third position to the initial position.

* * * * *